United States Patent
Landsgesell

(10) Patent No.: US 6,268,996 B1
(45) Date of Patent: Jul. 31, 2001

(54) CAPACITOR CONNECTOR, ESPECIALLY FOR AN ELECTROLYTIC POWER CAPACITOR

(75) Inventor: Jürgen Landsgesell, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/424,732
(22) PCT Filed: May 29, 1998
(86) PCT No.: PCT/DE98/01471
§ 371 Date: Apr. 5, 2000
§ 102(e) Date: Apr. 5, 2000
(87) PCT Pub. No.: WO98/54738
PCT Pub. Date: Dec. 3, 1998

(30) Foreign Application Priority Data

May 31, 1997 (DE) .............................. 197 22 910

(51) Int. Cl.[7] .................................... H01G 4/228
(52) U.S. Cl. ...................... 361/540; 361/306.1; 361/328; 361/541
(58) Field of Search .................... 361/822, 823, 361/830, 522, 540, 541, 533, 306.1

(56) References Cited

U.S. PATENT DOCUMENTS

| | | | |
|---|---|---|---|
| 1,826,869 | * 10/1931 | Everett | 361/822 |
| 3,619,478 | 11/1971 | Staiger | 174/267 |
| 5,493,471 | * 2/1996 | Walther et al. | 361/328 |
| 5,926,357 | * 7/1999 | Elias et al. | 361/302 |
| 5,953,201 | * 9/1999 | Jakoubovitch | 361/303 |

FOREIGN PATENT DOCUMENTS

| | | |
|---|---|---|
| 19 15 780 | 10/1970 | (DE) . |
| 44 39 272 | 5/1996 | (DE) . |
| 0 450 122 | 10/1991 | (EP) . |

* cited by examiner

Primary Examiner—Anthony Dinkins
(74) Attorney, Agent, or Firm—Kenyon & Kenyon

(57) ABSTRACT

A capacitor terminal is described, in particular for an electrolyte power capacitor, with which the capacitor is mechanically and electrically connected to a fastening part and/or to electric conductors. The capacitor terminal on the capacitor itself is designed as a contact stud having a relatively long, smooth contact area. The contact stud is designed in the form of a cylinder having a round or oval cross section or a rectangular tube connection. The part accommodating the contact stud is composed of a contact spring accommodating the contact stud for mechanical fixation and to establish the electric contact and which is attached to a connection strip. An extra spring can surround the contact spring in a ring to increase the contact force. Multiple capacitors may be connected to the connection strip by a simple plug-in technique, i.e., without screw connections, forming a capacitor bank attached to a common heat sink in a simple, tolerance-equalizing manner without exposing the terminals to unnecessary forces.

21 Claims, 2 Drawing Sheets

CAPACITOR CONNECTOR, ESPECIALLY FOR AN ELECTROLYTIC POWER CAPACITOR

FIELD OF THE INVENTION

The present invention relates to a capacitor terminal for an electrolyte power capacitor, with which the capacitor can be mechanically and electrically connected to a fastening part and/or electric conductors.

BACKGROUND INFORMATION

Conventional capacitors, in particular electrolyte power capacitors, are provided with terminals to be screwed or soldered. Each capacitor thus has at least two screw-type terminals or solder lug terminals provided for the electric terminal poles.

Typically electric connections to a capacitor bank composed of multiple capacitors and to semiconductor power circuit-breakers are created by using a connection strip commonly known as a busbar. The busbar is bolted to the capacitor terminals and the terminals of the semiconductor power circuit-breakers. Tensile and/or compressive forces occur because the individual components are not at the same height because of different tolerances. These forces are harmful, because only low-force loading is allowed at the terminals of these components. To increase the efficiency, capacitors are connected mechanically and essentially rigidly to a heat sink at the bottom of the can and are often mounted on it. If multiple capacitors are rigidly mounted on the same heat sink to create a capacitor bank, the problems mentioned above with the tolerances at the capacitor terminals occur to a greater extent. In addition, it is generally very time-consuming and thus cost-intensive to attach the screw connections or solder the terminals in the final assembly of such capacitor banks.

SUMMARY

The capacitor terminal according to the present invention, has the advantage that the special design of the terminals on the capacitor forms the basis for a simple tolerance-equalizing plug connection that prevents harmful force loads on the terminals.

For implementation of the present invention, the capacitor terminal on the capacitor itself may be designed as a contact stud with a relatively long, smooth contact area.

In an example embodiment of the present invention, the contact stud is in the form of a cylinder having a round or oval cross section or a rectangular tube connector, in particular a square connector.

According to an advantageous embodiment of the present invention, the contact stud has a thickened area on its side facing away from the capacitor. This prevents the capacitor from slipping out of its plug connection even more effectively.

In one example embodiment according to the present invention, the part accommodating the contact stud is composed of a contact spring accommodating the contact stud with simultaneous mechanical fixation and attachment to establish the electric contact. The contact spring is attached to a carrying part. This completes a simple and tolerance-equalizing plug connection.

In an especially advantageous embodiment of this part of the capacitor terminal, the contact spring is designed in a ring shape and surrounds the contact stud on all sides. As an alternative, the contact spring provided for a contact stud may be composed of multiple component springs, each coming to lie on a sector of the contact area of the contact stud. The choice of which type is most suitable will be determined by the requirements of the given application.

According to another advantageous embodiment of the present invention, the contact spring and/or the component springs have slightly bent shape, in particular a C-shape, in the contact area as seen from the side. This greatly facilitates insertion of the contact stud of the capacitor into the respective contact springs while also ensuring a reliable electric contact.

According to advantageous embodiments of the present invention, the contact spring and/or the component springs forming it are connected to different conductor parts of a connection strip, in particular a busbar, in accordance with the respective electric terminals. Multiple capacitors may be fixedly connected to one connection strip in an advantageous manner.

In an advantageous manner, the present invention permits the tolerance-equalizing construction of a capacitor bank composed of multiple capacitors whose capacitor terminal is designed according to the present invention, and where the capacitors are rigidly connected to a common heat sink at the bottom of each can, in particular by using clamp or screw connections.

DETAILED DESCRIPTION

Figure 1:
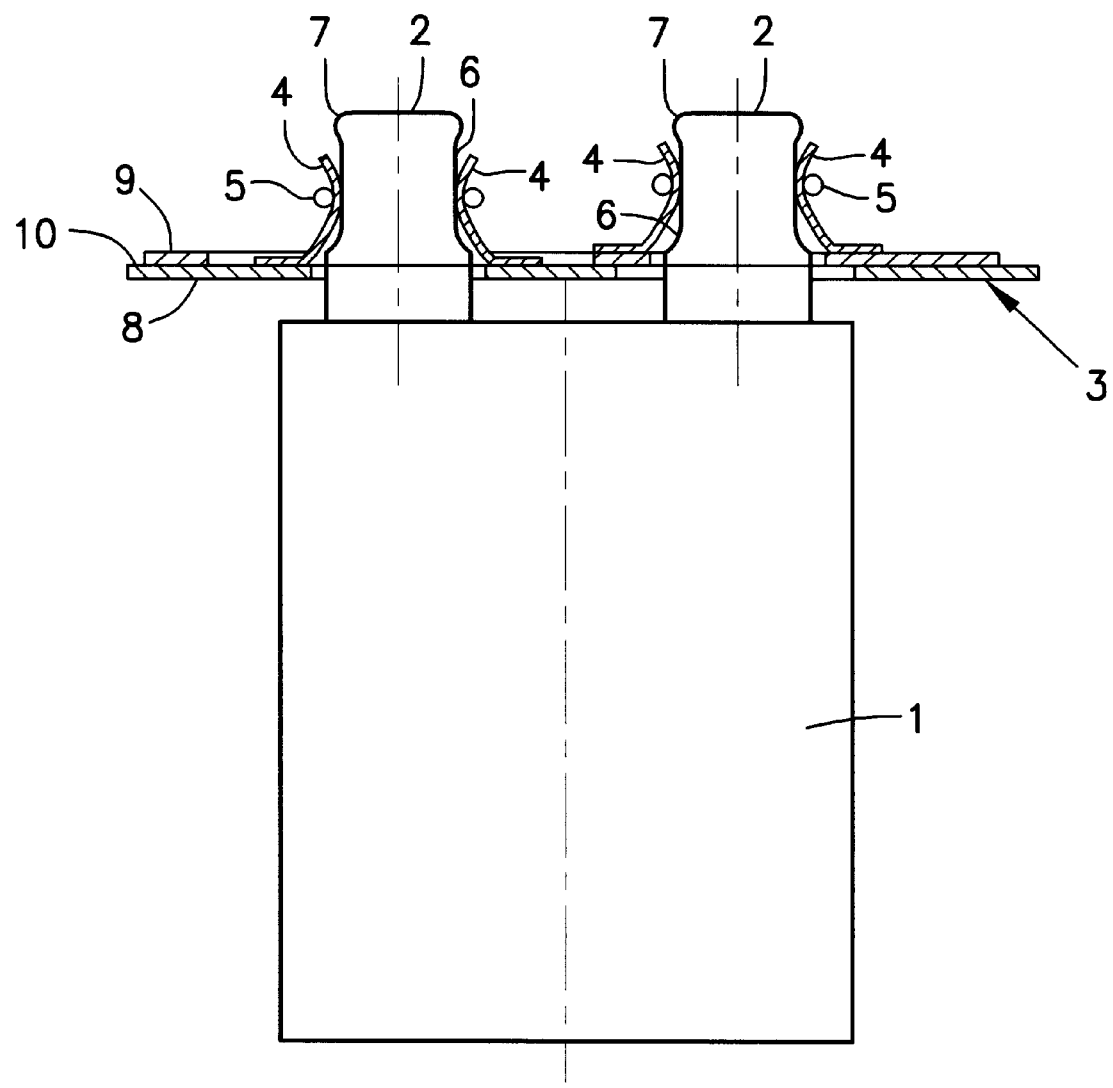
FIG. 1 shows a schematic side view of a capacitor having contact studs designed according to the present invention and a connection strip having contact springs designed according to the present invention.

FIG. 1 shows a schematic side view of a capacitor 1 having contact studs 2 designed according to the present invention and a part of a connection strip 3 having contact springs 4 designed according to the present invention. To increase the pressure force, there is an extra spring 5 surrounding and gripping contact spring 4, for example, in the form of a ring.

Each contact stud 2 establishes electric contact with the capacitor in accordance with the respective terminal and also provides mechanical fixation and attachment at the same time. Contact stud 2 is preferably designed in the form of a cylinder with a round or oval cross section, as shown in FIG. 1. However, it may also be in the form of a rectangular tube connector, for example, a square. Contact area 6 of contact stud 2 which establishes the mechanical and electric contact is relatively long as seen in the longitudinal direction of the contact stud and is designed to be smooth. This ensures a design which equalizes different tolerances for fixed attachment and electric contacting. The lengths of the components are thus equalized within the contact.

To achieve further security and a reliable snap engagement on insertion, contact stud 2 has a thickened area 7 on its side facing away from capacitor 1, running as a bead around the outer edge of contact stud 2. This effectively prevents contact stud 2 from slipping out of contact springs 4.

The part accommodating contact stud 2 has a contact spring 4 which accommodates contact stud 2 for mechanical fixation and for establishing the electric contact and which is attached to a carrying part, in particular a connection strip 3. This connection strip 3 is also referred to as a busbar. As shown in the embodiment illustrated in FIG. 1, connection strip 3 may have two different, mutually insulated conductor parts 8 and 9 which, separated by an insulation layer 10, are provided for the two electric terminals. Contact spring 4 is attached either to lower conductor part 8 or to upper conductor part 9 of connection strip 3 according to the respective electric terminal.

Contact spring 4 may also be composed of the component springs forming it, contacting contact stud 2 in sectors. This case is not shown in FIG. 1. These component springs are attached to connection strip 3 in the same way as are one-piece contact springs 4.

Connection strip 3 may be designed so that multiple capacitors can be connected to it to form a capacitor bank. The mechanical connection between contact springs 4 with respective conductor parts 8 and 9 is accomplished by welding or soldering, for example.

Contact spring 4 and/or the component springs have a slightly bent shape, in particular a C-shape, in contact area 6 as seen from the side. This greatly facilitates the insertion of contact studs 2 of capacitor 1 into respective contact springs 4 while also ensuring a reliable electric contact and a secure attachment.

If multiple capacitors 1 are combined to form a capacitor bank connected electrically by a busbar and optionally mechanically secured as well, the capacitors may be provided with heat sinks in a conventional manner. To do so, the can bottoms of the individual capacitors are rigidly attached to heat sinks, preferably a common heat sink, by clamps or screw connections. On the other side, the capacitors are electrically and mechanically secured and connected to one another by the busbar. Such a capacitor bank may be connected to the same busbar with the semiconductor power circuit-breakers by the same fastening technique as described in the present invention or in the traditional manner.

Figure 2:
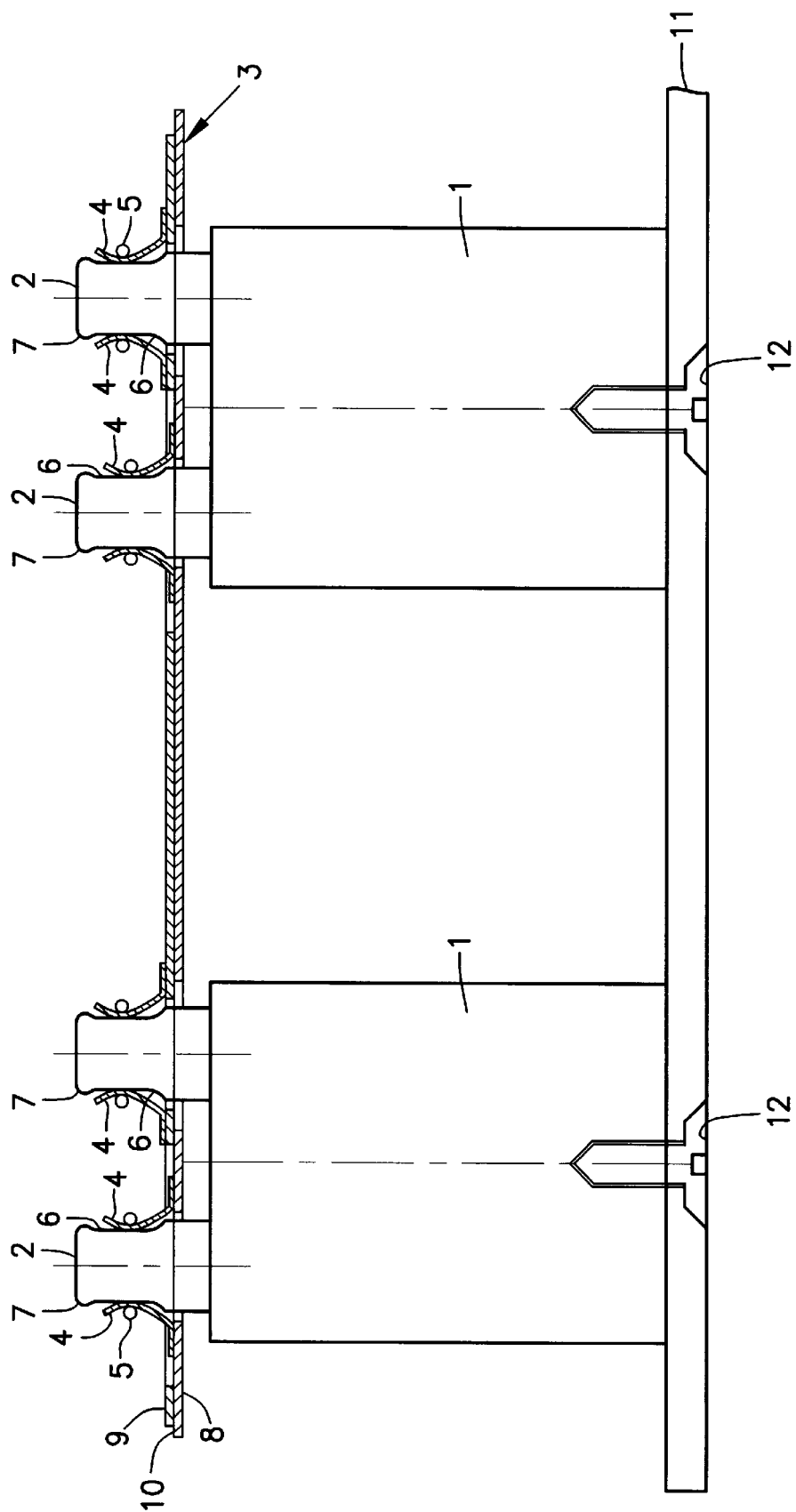
FIG. 2 shows a capacitor bank.

FIG. 2 shows a capacitor bank with two capacitors 1. The same reference numerals used in FIG. 1 are used to designate corresponding elements in FIG. 2. Each of the two capacitors 1 has a contact stud 4 having a contact area 6. The contact studs 4 serve to mechanically and electrically contact the two capacitors 1 to one of a fastening part 3 and an electronic conductor 8, 9. The can bottoms of the capacitors 1 are attached to a common heat sink 11 by means of screw connections 12.

The advantages achieved with the capacitor terminal designed according to the present invention include the fact that no screw connections are necessary in assembly; the lengths of the components are compensated within the contact; the difference in length expansion of the components is compensated by the spring contact; the forces caused by the components of different lengths are eliminated, so there is less load on the component terminals in an advantageous manner, and finally, if the contact stud is already part of the capacitor terminal, only the contact spring and optionally the extra spring are necessary. This has an effect in particular when multiple capacitors are mounted at the can bottom on a common heat sink, e.g., by a screw connection, to form a capacitor bank.

What is claimed is:

1. A capacitor terminal, comprising:
   a contact stud having a contact area, the contact stud for mechanically and electrically connecting the capacitor to one of a fastening part and an electric conductor.

2. The capacitor terminal according to claim 1, wherein the capacitor terminal is for an electrolyte power capacitor.

3. The capacitor terminal according to claim 1, wherein the contact stud is a cylinder having one of a round and oval cross section.

4. The capacitor terminal according to claim 1, wherein the contact stud is a rectangular tube connector.

5. The capacitor terminal according to claim 4, wherein the contact stud is a square tube connector.

6. The capacitor terminal according to claim 1, wherein the contact stud includes a thickened area on a side facing away from the capacitor.

7. The capacitor terminal according to claim 1, wherein the capacitor includes a part accommodating the contact stud, the part including a contact spring for mechanical fixation and for establishing electric contact, the contact spring being attached to a carrying part.

8. The capacitor terminal according to claim 7, wherein the carrying part is the fastening part.

9. The capacitor terminal according to claim 7, wherein the contact spring is ring-shaped and surrounds the contact stud on all sides of the contact stud.

10. The capacitor terminal according to claim 7, wherein the contact spring includes a plurality of component springs, each of the component springs lying on a sector of the contact area of the contact stud.

11. The capacitor terminal according to claim 9, wherein the contact spring has a slightly bent shape in the contact area.

12. The capacitor terminal according to claim 11, wherein the slightly bent shape is a C-shape.

13. The capacitor terminal according to claim 10, wherein the component springs have a slightly bent shape in the contact area.

14. The capacitor terminal according to claim 13, wherein the slightly bent shape is a C-shape.

15. The capacitor terminal according to claim 7, further comprising:
   an second spring surrounding and gripping the contact spring to increase a pressure force.

16. The capacitor terminal according to claim 15, wherein the second spring is ring-shaped.

17. The capacitor terminal according to claim 7, wherein the contact spring is connected to the fastening part, the fastening part including a conductor part of a connection strip.

18. The capacitor terminal according to claim 17, wherein the connection strip is a busbar.

19. The capacitor terminal according to claim 7, wherein multiple capacitors are fixedly connected to one fastening part, the fastening part including a connection strip.

20. A capacitor bank, comprising:
   a plurality of capacitors, each of the plurality of capacitors having a contact stud having a contact area, the contact stud for mechanically and electrically connecting the capacitor to one of a fastening part and an electric conductor, the plurality of capacitors being rigidly connected to a common heat sink using one of clamp and screw connections.

21. The capacitor bank according to claim 20, wherein the contact stud has a long, smooth contact area.

* * * * *